United States Patent [19]

Sutherlin et al.

[11] 4,163,290
[45] Jul. 31, 1979

[54] HOLOGRAPHIC VERIFICATION SYSTEM WITH INDEXED MEMORY

[75] Inventors: Kent K. Sutherlin, Los Altos; Ted J. Crowther, Saratoga; Kent A. Salmond, Los Gatos, all of Calif.

[73] Assignee: Optical Data System, Mountain View, Calif.

[21] Appl. No.: 440,897

[22] Filed: Feb. 8, 1974

[51] Int. Cl.$^2$ .............................................. G11C 13/04
[52] U.S. Cl. ..................................... 365/125; 350/3.5; 365/120; 365/127; 365/193; 365/216; 365/233
[58] Field of Search .................... 340/173 LM, 173 R; 350/3.5; 365/125

[56] References Cited

U.S. PATENT DOCUMENTS

| 3,832,698 | 8/1974 | Ishii | 340/173 LM |
| 3,841,729 | 10/1974 | Ando | 340/173 LM |
| 3,849,766 | 11/1974 | Crowther et al. | 340/173 LM |
| 3,891,976 | 6/1975 | Carlsen | 340/173 LM |

*Primary Examiner*—Terrell W. Fears
*Attorney, Agent, or Firm*—Townsend and Townsend

[57] ABSTRACT

A verification system utilizing a holographic memory defined by a multiplicity of individual holograms on a photographic strip arranged side by side in elongate, parallel, hologram channels of substantially equal length. A holographic index on the strip identifies the information stored in each channel. The memory is a holographic record of binary spot patterns of multi-digit numbers which are sequentially recorded. The spot pattern for any given number may extend over one or more holograms to fully utilize the available recording space. Data compression is employed to reduce or eliminate the recordation of digits which are identical to corresponding digits of a preceding number to thereby reduce the memory bulk. A given number to be verified is entered in a keyboard and stored, the index is searched and the appropriate memory channel is then searched for a match of the given number with a number in the memory by producing and detecting images from the recorded holograms. The presence or absence of such a match is signalled to the operator to thereby complete the verification process.

29 Claims, 10 Drawing Figures

FIG_1

FIG_3

```
CELL   1    2    3    4
      876  432  718  966
      876  432  719  402  6
CELL   1    2    3    4    5
```

FIG_4

FIG_5

FIG_6

FIG_7

FIG_8

FIG_9 (PRIOR ART)

FIG_10

HOLOGRAPHIC VERIFICATION SYSTEM WITH INDEXED MEMORY

BACKGROUND OF THE INVENTION

Substantial work and advances have recently been made in the field of holographic data storage and retrieval systems. Such systems have very high storage densities, are readily and inexpensively duplicated, do not deteriorate with time and have, therefore, substantial advantages over more conventional systems employing magnetic tapes or discs, punched cards or tapes, etc.

The commonly owned, copending U.S. patent application Ser. No. 254,589, filed May 18, 1972, now U.S. Pat. No. 3,849,766 for "DATA STORAGE AND RETRIEVAL SYSTEM", the disclosure of which is incorporated herein and made a part hereof by reference, describes in detail a prior art holographic data storage and retrieval system particularly adapted for high speed and relatively inexpensive verification systems for making credit checks, identifying persons, permitting access to restricted areas, authenticating airline tickets and the like. The system described in that application enables the determination of whether or not the holder of an identifying or authorizing instrument such as a credit card, identity card, ticket or the like is entitled to what the instrument appears to entitle him. The disclosed system can significantly reduce credit frauds, unauthorized entries to restricted areas and the like.

In general terms, such prior art verification system compares an identifying symbol, mark, description, letter or number, hereinafter sometimes collectively referred to as "number", with a memory of a group of some such numbers. The number group may, for example, represent the bad credit risks or a stolen card within a credit card system. When a check is made the number of the card holder is compared with the number in the memory to determine whether or not the reference number matches a recorded number. The absence of a match indicates that no abnormal condition exists and, for example, that the customary credit or service can be extended to the card holder, or that he may be admitted to a given area. If a match is found, the operator is advised that an abnormal condition exists. The operator may further be advised that credit or access is to be refused or restricted.

The prior art device is intermittently updated by replacing or updating its holographic memory and is placed at each check-point and addressed each time the operator is about to extend credit, permit access or the like. The holograms are recorded in longitudinal rows on a strip of photographic film such as a length of 35mm film. The film strip is moved parallel to the rows past a read station and laser light is directed to a particular row to reconstruct images of the hologram. The images are serially sensed and each sensed image is compared with a given number to be verified.

The memory itself is a film strip with a plurality, e.g. 40 rows, of independent holograms recorded side-by-side. The numbers in the sub-group are randomly assigned to the film rows of channels and each hologram stores one credit card number. Predetermined digits of the number, say the first two or three, are used for randomly assigning the numbers to a channel. When a number is to be verified it is keyed into the system, the appropriate channel is addressed by directing the laser beam therethrough and the film is then advanced past the beam. A spot pattern is generated by each hologram passing the beam. The spot pattern is compared with the keyed-in number to find the presence or absence of a match.

This prior art system represents a very significant advance over systems theretofore proposed. The supporting hardware is relatively inexpensive to construct so that it made it economically feasible to place a unit at each check-point, e.g. at each cash register. Further economies could be obtained by multiplexing a unit to a plurality of check-points. However, the system exhibited some inflexibility because it was generally limited for use with only one type of number, e.g. a given type of credit card. Furthermore, as is more fully described hereinafter, the memory employed in that system duplicates substantial amounts of identical data and is therefore relatively bulky. Also, the manner of recording the numbers on the different film channels frequently yielded grossly disproportionate channel lengths when the numbers within a credit card system, for example, were not random numbers. This in turn leads to a waste of film material and increases average memory access times.

SUMMARY OF THE INVENTION

The present invention provides a holographic data verification system which is capable of simultaneously verifying numbers, as the term is defined above, belonging to one or more number systems, e.g. belonging to several types of credit cards. Thus, the present invention provides a readily accessible memory which may store any desired number of "number systems". As used herein, the terms "number system" or "number type" denote a set of number which may, for example, be the cards issued by a given airline, or the identity of persons within a group of persons, say within the military or within a military service, and the like. Consequently, each number system includes an identifying symbol for the numbers which belong to it, and any given number may be duplicated in two or more such systems, which, therefore, might only be distinguishable by their identifying symbol.

The present invention also records the holograms of the memory in a plurality of parallel elongate hologram rows or channels. In contrast to the prior art, however, and to minimize access times and the length of film required by the memory the channels are of "substantially equal length". As used herein, the term "substantially equal length" is intended to mean and means lengths which are approximately the same although they may vary slightly but insignificantly; and further the term means that at least one channel may be of a significantly shorter length in case the memory includes an insufficient number of holograms to fill all channels.

Since it cannot be predicted in advance how many numbers from each number system will be recorded in the memory, and since the hologram channels of the memory are of substantially equal length, it is not possible to assign in advance one or more channels to any number system. Instead, in accordance with the present invention, the numbers in each number system and the number groups themselves are sequentially recorded. To avoid the need for scanning all hologram channels for a given number an index for the memory is provided.

The index is preferably a holographic index attached to the memory, that is recorded on the same film strip, and identifies the information recorded on each memory channel. Means is provided for searching the index to determine the channel in which a given number would be recorded if it is recorded on the memory and for thereafter searching such channel to find the presence or absence of the match between the keyed-in number and the numbers recorded on such channel.

The index renders the memory of the present invention universally usable, that is the memory is no longer limited for use with a simple number system. Also, the recorded numbers need not be recorded in a predetermined channel of the memory. Instead, the index enables the inclusion in the memory of any desired number of number systems, each system having any desired volume of numbers. The channel in which a given number would be recorded is determined by its number system as well as the volume of numbers that are recorded in the memory. Furthermore, since the numbers recorded in the memory are not in any manner preassigned to certain channels, the channels can be maintained at equal length so that no one channel is substantially longer than the other. Average memory access time as well as the total film consumption are thereby minimized.

A further reduction in both the access times and film consumption is obtained by compressing the recorded data in accordance with the present invention. Such data compression utilizes practically all recording space available in each of the holograms irrespective of whether or not the recording space of any given hologram is simultaneously occupied by one or more numbers. Furthermore, only such digits of each number are recorded as differ from the previously recorded number.

This data compression is accomplished by dividing each multi-digit number into number cells of say 3 digits and assigning each cell a "field address". The first number of the memory or of a number system is fully recorded with a field address preceding each cell. Thus, a 12 digit number might have four field addresses. If the next number recorded in the memory is identical to the preceding one except that the tenth digit differs, for example, such following number is recorded by merely recording its fourth cell and identifying such cell with field address" four". This following number is read as having the first three number cells identical to the first three number cells of the preceding number. To identify the beginning of a new number each number is followed by a separate stop code which initiates the reading of a new number.

In a practical embodiment of the invention in which the memory comprises 56 bit holograms and stores 100,000 12-digit numbers plus identity and information codes, a total of 100,000 holograms is required in the absence of data compression. If the stored numbers are 13-digit numbers, 200,000 holograms are required. In contrast thereto, with the data compression of the present invention it is typically possible to store the 100,000 12-digit numbers on only approximately 70,000 holograms. If the number had 13 digits only 75,000 holograms would be recorded. Thus, in the former case there is a memory bulk reduction of approximately 30% while in the latter case there is a memory bulk reduction of approximately 60%.

The present invention further provides apparatus for the retrieval of data recorded as described above, and for comparing information, say of a keyed-in number with recorded information to verify the presence of absence of the keyed-in number in the memory. The presence or absence of such a match can then be used to draw conclusions and the memory may further include additional information with respect to keyed-in numbers that find a match in the memory for display and communication to the operator.

Broadly speaking, data retrieval and verification apparatus constructed in accordance with the present invention includes the thus described index memory in combination with a suitable light source, e.g. a laser, means for directing the laser to the selected channel and means for searching the holograms to generate binary spot patterns. A suitable detector generates output signals responsible to the spot patterns sensed by it and means is further provided for comparing the keyed-in number with the output signals. To reduce the access time the numbers in each memory channel are numerically arranged, that is in an ascending or descending order, and the absence of the match between the stored data and the keyed-in number is signalled as soon as the searched numbers are greater or smaller, respectively, than the keyed-in number. Such signalling usually takes the form of the illumination of one of two signal lights, the one indicating the presence of the match and the other indicating the absence of the match.

To enhance the accuracy of the check performed by a verifier constructed in accordance with the invention, means can be provided for performing a parity check. Common credit card number systems have a parity digit which is a function of all or some of the remaining digits in the number. Any digit of the number can be made a parity digit and there is a wide variety of parity systems such as Mod-7, Mod-10, Mod-11 and like systems employed by the various credit card issuing authorities. The parity digit performs two functions. First it assures that the keyed-in number, say the keyed-in credit card number, is an actual number of the given system and not a fabricated one. Secondly, a parity check assures that the number as entered in the keyboards is the correct number. A parity check will fail if the operator wrongly enters any of the digits. if such an error were left undetected, the subsequent verification of the number in the memory would be worthless. With the parity check as provided by the present invention the possibility of such an error is eliminated. This is accomplished by including holographic directions on the memory film strip and supporting circuitry to make a parity check or calculation as soon as the number has been keyed-in. In the preferred embodiment of the invention holographic information for the parity check is included in the memory index and can be performed while the device and in particular while the laser is being aligned with the necessary memory channel for the searching thereof.

As is described in the referenced copending patent application, the holographic memory is preferably stored in replaceable cassettes to facilitate the updating of the memory by inexperienced personnel which need not be familiar with the design and operation of the readout device. For proper operation of the verifier of the present invention it is, of course, necessary that the laser light beam is directed to a memory channel and that the index and memory are sequentially read. Since the hologram channel width and beam diameter are very small and in the order of approximately 0.020 inch alignment of the channels and the beam are difficult, particularly when the film is mounted in a cassette due to manufacturing tolerances of the cassette, the film, the film mounting and the hologram recordation. To eliminate the need of extremely stringent tolerances, which would greatly increase manufacturing costs and which are subject to loss due to ordinary wear and tear the present invention provides automatic initialization means which assure that the laser beam is directed at a memory channel and that the film strip is in its original or beginning position before a data readout or verification process can commence. The initialization means determines the relative back tracks towards the original position until it finds a channel and the original film position. If the backtracking operation remains negative after repeated efforts as would be the case if, for example, the film in the cassette were ruptured the initialization means ceases its searching after a predetermined time interval and turns the device off. In such an event the signalling of a wrong "no match" verification signal, which would otherwise be obtained, is impossible because the initialization means prevents the commencement of the verification process.

In the preferred embodiment of the present invention the memory is formed by a standard 35mm film strip which has longitudinally extending hologram channels as described in the above-referenced copending patent application. The film is moved longitudinally past a laser beam and means is provided for moving the laser beam transversely to the film motion to center it on a given hologram channel. The centering is automatically performed with output signals obtained from the spot pattern detector by arresting the transverse beam movement when such signals are sensed. A precise alignment of the beam, which normally has a diameter about equal to the width of the holograms, is difficult to achieve due to unavoidable variations in the operating characteristics and particularly the brake response times of the laser positioning drives. Accordingly, the beam may be off center by as much as one-half its diameter or more which can distract from the quality of the spot patterns generated by the beam.

The present invention enables a much more accurate alignment of the laser beam. This is accomplished by constructing holograms used for centering the beam aligned with but substantially narrower than the memory channels. In this manner differences in the brake response times for the drives have a much lesser influence. Consequently, even under the most adverse conditions all or at least a major portion of the laser beam is aligned with the memory channel. Higher quality images generated from the holograms are thereby assured.

DESCRIPTION OF THE PREFERRED EMBODIMENTS

Figure 1:
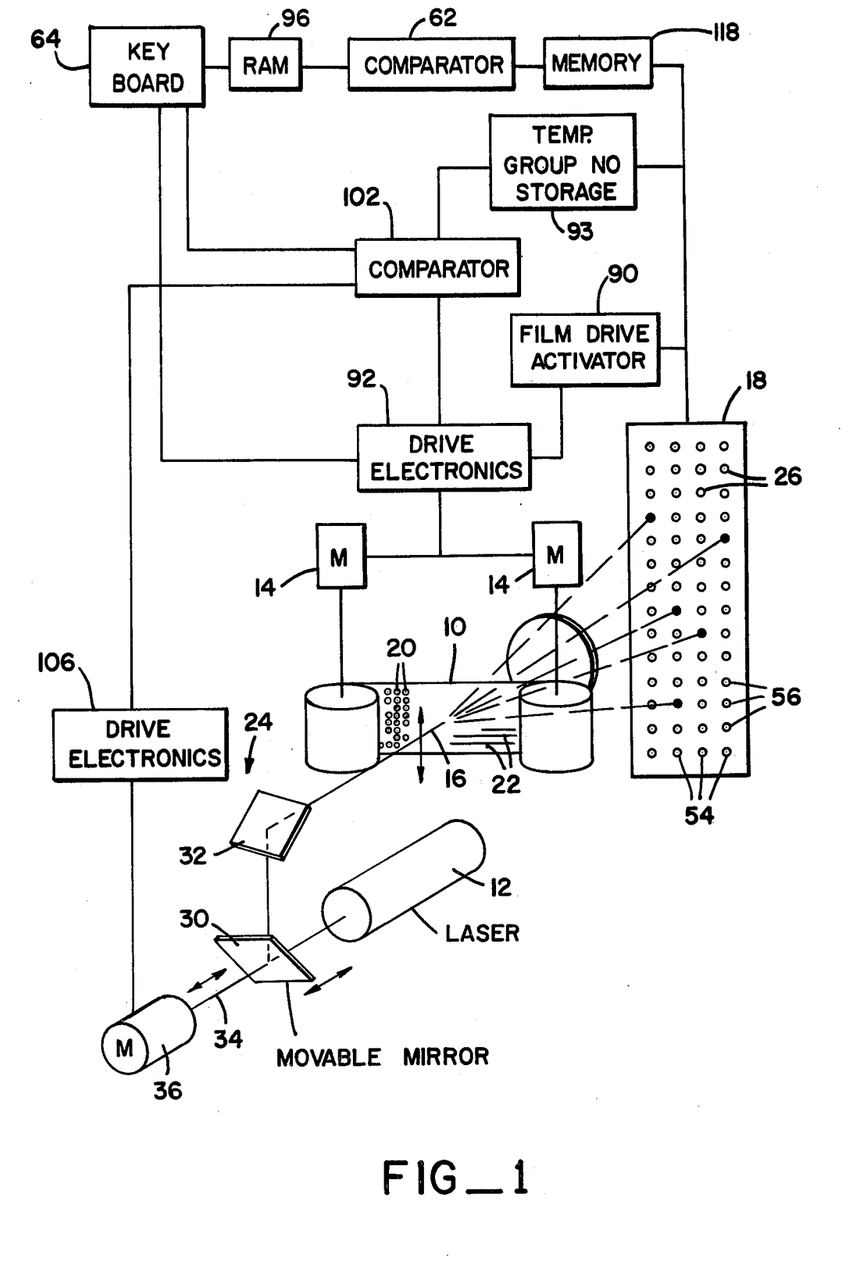
FIG. 1 is a schematic representation of a holographic verification system constructed in accordance with the present invention.

Referring to FIG. 1, a holographic verifier constructed in accordance with the present invention broadly comprises a holographic memory in the form of an elongate film strip 10, a light source such as a laser 12, motors 14 for reciprocating the film longitudinally past a light beam 16 from the laser and a detector 18 upon which images are reconstructed from holograms 20 on the film. The holograms are recorded on the film in a plurality of longitudinal, parallel hologram rows 22. Means such as a reflector arrangement 24 is also provided for moving laser beam 16 perpendicular to the film movement to any one of the hologram rows.

The holograms on the film may have a size of approximately 0.020 inch square and they are arranged side-by-side so that edges of adjacent holograms in a row touch to fully utilize the available film area. With 0.020 inch square holograms, 40 hologram channels 22 can be recorded on a standard 35mm film with a spacing between adjacent rows of about 0.008 inch. The laser beam is focused on the film with a lens (not shown) and has a diameter approximately 25 percent smaller than the size of the holograms, or about 0.015 inch. As the film moves past the beam, the beam reconstructs an image from each hologram on the detector. The holograms comprise holographic records of spot patterns, preferably binary spot patterns of numbers which are reconstructed by the light beam on the detector and sensed by photosensitive cells or diodes 26. The cells, arranged in columns and rows, are electronically scanned to obtain a digital electronic output signal responsive to the particular spot pattern displayed on the detector.

Holograms 20 are of the Fourier transform type to gain the advance of shift invariance so that the spot pattern is imaged on the detector irrespective of whether or not the laser and/or the film are precisely aligned and positioned so long as the laser strikes any part of the hologram.

Figure 2:
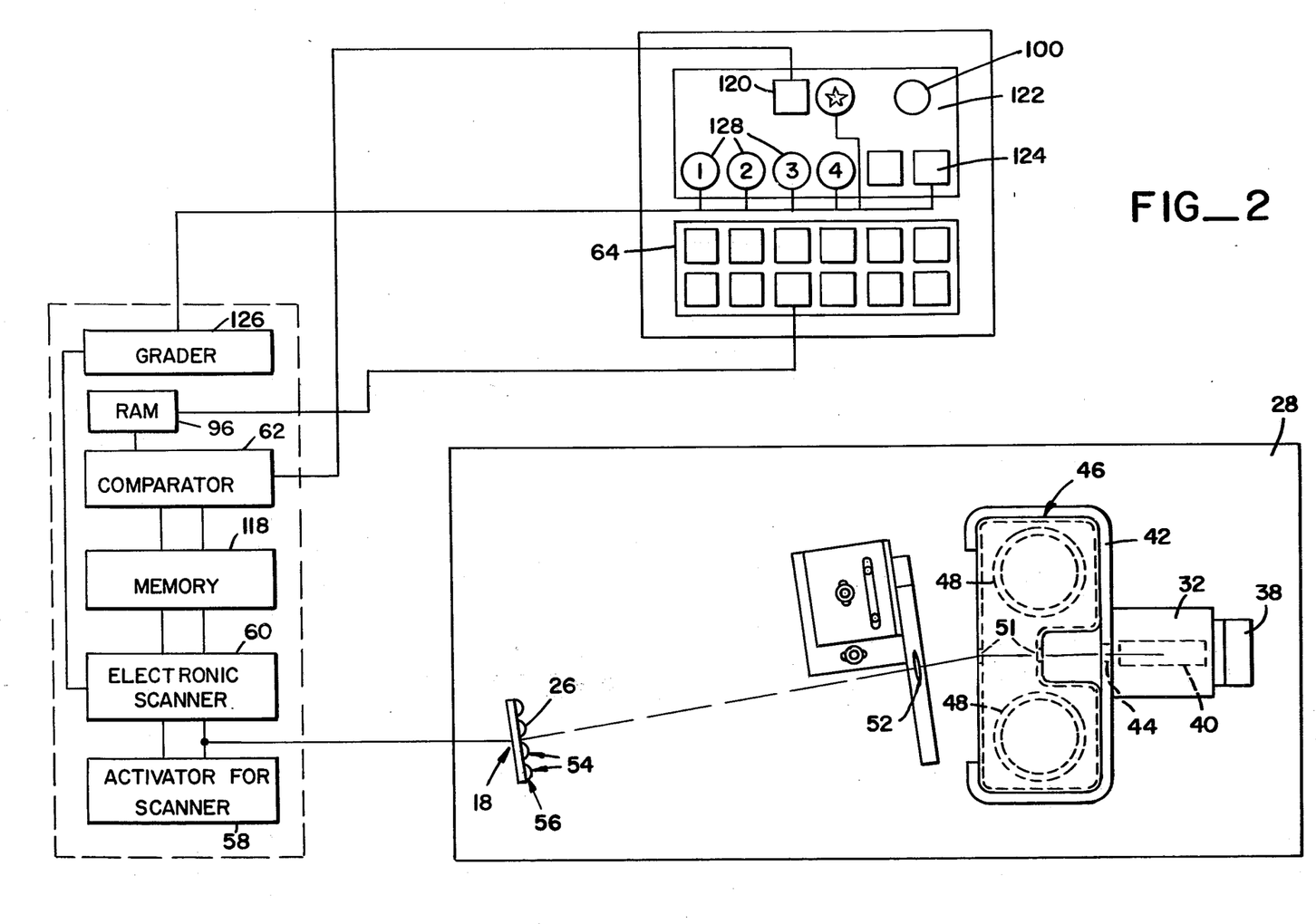
FIG. 2 is a plan view of the holographic verifier constructed in accordance with the present invention and particularly illustrates the portion of the apparatus reconstructing images from the holographic memory, the keyboard input and data readout and, schematically, the supporting electronic logic.
Figure 3:
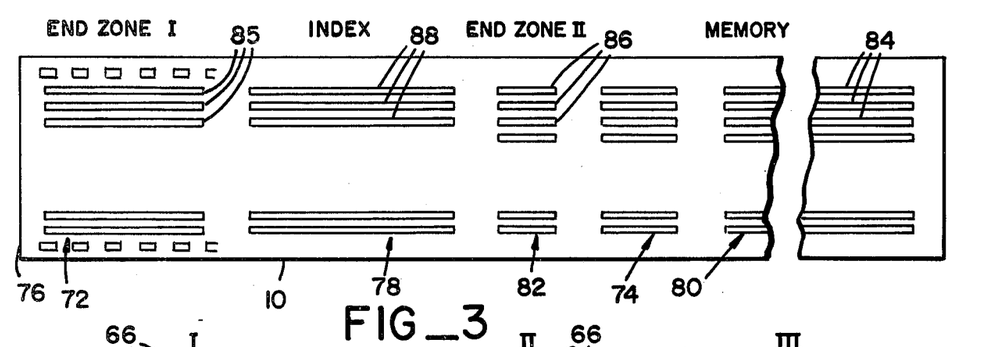
FIG. 3 is a fragmentary enlarged plan view of a film strip constructed in accordance with the invention carrying a holographic memory, a holographic index and position identifying end zones.

Referring to FIGS. 1 to 3, reflector system 24 is disposed on the righthand side (as viewed in FIG. 2) of support plate or optical bench 28 and comprises a longitudinally removable mirror 30 and a stationary mirror 32. The movable mirror is mounted to the underside of the optical bench and is guided parallel to the lasser beam on guide bars (not shown). A lead screw 34 is threaded through the body of mirror and a reversible motor 36 is mounted to base 28 and drives the lead screw.

The stationary mirror 32 is mounted to the upper side of the optical bench with a bracket 38. The stationary mirror is disposed over an oblong aperture 40 in optical bench 28 which in turn is disposed over and in alignment with the travel path of the movable mirror.

Both mirrors have 45° reflecting surfaces which intercept the laser beam and direct it first upwardly past a bench aperture 40 and then parallel to the optical bench. By moving mirror 30 to the left or right, as used in FIG. 1, the upwardly directed motion of the laser beam strikes the reflecting surface of the stationary mirror at a lower or higher point. The distance between the laser beam deflected by the stationary mirror and the optical bench can thus be corresondingly increased or decreased while the beam remains parallel to the bench.

A generally rectangular receptable 42 is mounted to the upper side of the optical bench 28 and includes a vertical slot 44 aligned with bench aperture 40. A film cassette 46 is removably placed into the receptacle. A pair of film spools 48 are inside the cassette and store a length of 35mm film. A center portion 50 of the cassette has a reduced thickness and includes a spring biased pressure plate (not separately shown) that gently biases the film between the spools against a vertical film positioning gate of the cassette which is perpendicular to the laser beam reflected by the stationary mirror. The pressure plate and the cassette walls include vertical slits or sight apertures 51 that are aligned with receptacle slot 44 and which have a sufficient vertical extent so that the high and low laser beam reflected by the stationary mirror can pass through them.

The vertical adjustability of the laser beam permits the illumination of every part of the film over its usable width with a parallel light beam for uniform reconstruction of the images from the holograms recorded on the film on optical detector 18. The detector is angularly offset from the incoming laser beam for off-axis reconstruction of images from off-axis holograms on the film. The precise angular offset is determined by the manner in which the holograms are recorded.

A lens 52 images the off-axis portion of the laser beam on the detector. If the holograms are of the Fourier type, the lens performs an inverse Fourier transform of the off-axis light signal diffracted from the hologram to focus the signal on the optical detector at the back focal plane of the lens. The hologram on the film is usually a hologram of a binary spot pattern which is focused on the detector. The photodiodes 26 of the detector are arranged in cols. 54 and rows 56. The spot pattern is accurately aligned with photodiodes of the detector even if there exists some misalignment in the positioning of the film and/or the laser beam because of the "shift invariants" so that the spot pattern remains fixed on the photodiode array independently of the film and/or beam position.

Figure 10:
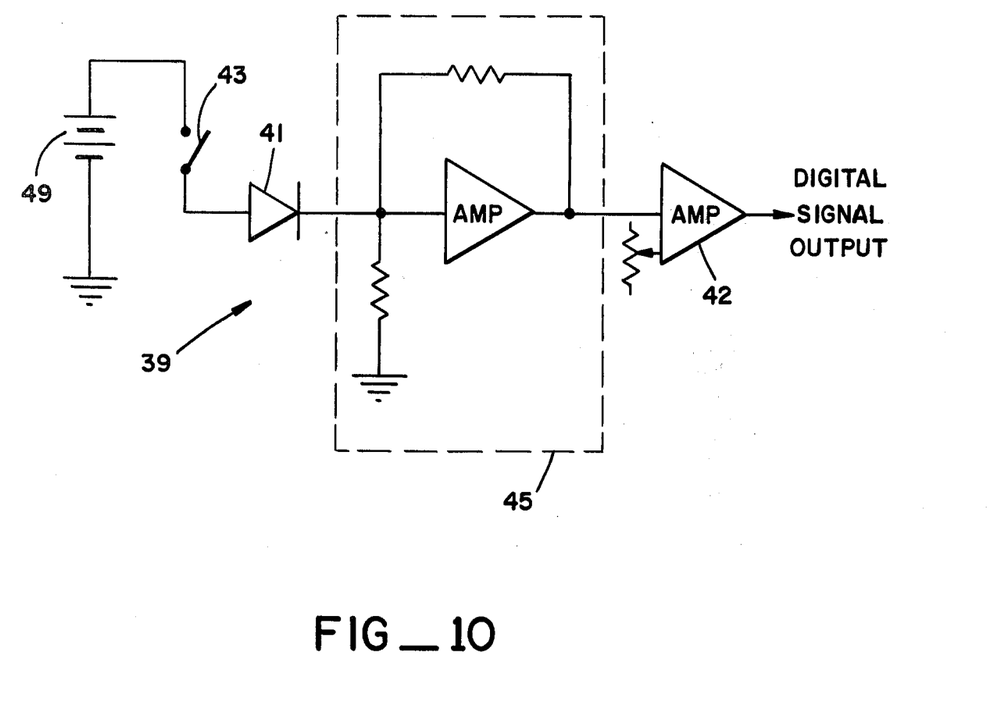
FIG. 10 is a schematic diagram of the circuitry measuring the response to light of the photodiodes defining the light detectors employed in the holographic verifier of the present invention.

Each detector in the array operates independently of the others and is defined by a circuit 39 illustrated in FIG. 10. A photodiode 41 is in series with a switch 43, an electrometer amplifier 45 and a threshold detector 47. In operation switch 43 is momentarily closed to charge the inherent capacitance of the photodiode to the voltage of battery 49. After a fixed, predetermined time interval, the switch is again momentarily closed. During this time interval the photodiode is or is not subjected to light from a spot pattern reconstructed on detector 18 (FIG. 1). If the diode is subjected to light its capacitance will discharge through the photodiode. Conversely, if the diode is not subjected to light the capacitance will hold its charge. When the switch is closed the second time a relatively high charging current will flow if the diode was subjected to light and will not flow if the diode was not subjected to light. This current surge is amplified and changed to a voltage by the electrometer amplifier 45. Threshold detector 47 then emits a digital pulse if the voltage representing current surge is large enough to cross the threshold. Thus, a digital pulse is generated at the time of the second closure of the switch if enough light has been on the photodiode so that the threshold can be crossed.

The just-described light detecting circuitry 39 has a double advantage over the more conventional method of measuring the presence or absence of light on the photodiode by measuring the diode current directly. First, it provides a much larger current signal because the light on the diode is measured for a relatively long period of time (e.g. 100 microseconds) while the surge current upon the closing of switch 43 is virtually instantaneous (e.g. within 1 nanosecond) and, therefore, larger. Secondly, the much lower impedance of the just-described circuitry together with the high surge current permit response times which are much faster than those attainable with the conventional methods of measuring the presence or absence of light on a photodiode. Consequently, detector 18 (FIG. 1) can be scanned much faster than was heretofore possible.

In use, as the film is driven past the laser beam, each hologram projects its 56 bit spot pattern on the array. It is preferred to maintain each pattern for about 500 microseconds. For 0.020 inch holograms this results in a film speed of about 40 inches per second. During the 500 microseconds time interval, one row is scanned every 10 microseconds to produce four current signals from each row representing a decimal digit of a number, a field address, or a stop code, as more fully described hereinafter.

For purposes of convenience, 12 rows of the detector are employed for the sensing of such digits. Two rows, e.g. the 1st and 14th rows, are set aside and can be used for auxiliary purposes such as for generating synch bits, for performing an internal parity check of the hologram, as distinguished from a parity check of the keyed-in number, and the like. Thus, photodiodes in these two rows are used as synch-detector photodiodes which initiate the scanning of the detector each time a spot pattern is reconstructed thereon. When the synch-detectors sence light, they trigger scanning activating circuit 58 which in turn initiates the electronic scanner 60 to read the data sensed by the photodiodes 26 of the detector 18. In this manner each scan of the detector is timely initiated irrespective of the film speed and difficult synchronization between the film speed and the electron scan of the detector is avoided.

The number to be verified that was entered in keyboard 64 is stored in a random access memory (RAM) 96 for comparison with the corresponding digits read off the detector 18. To this end, the signals from detector 18 are applied to a memory 118. Memory 118 and RAM 96 are connected to comparator 62 to accomplish the desired comparison. This parallel comparison of the stored number digits and the detected digits being read off is continued until all digits have been checked. If no match is detected, the comparison process is repeated with the next number stored in the holographic memory.

Figure 4:
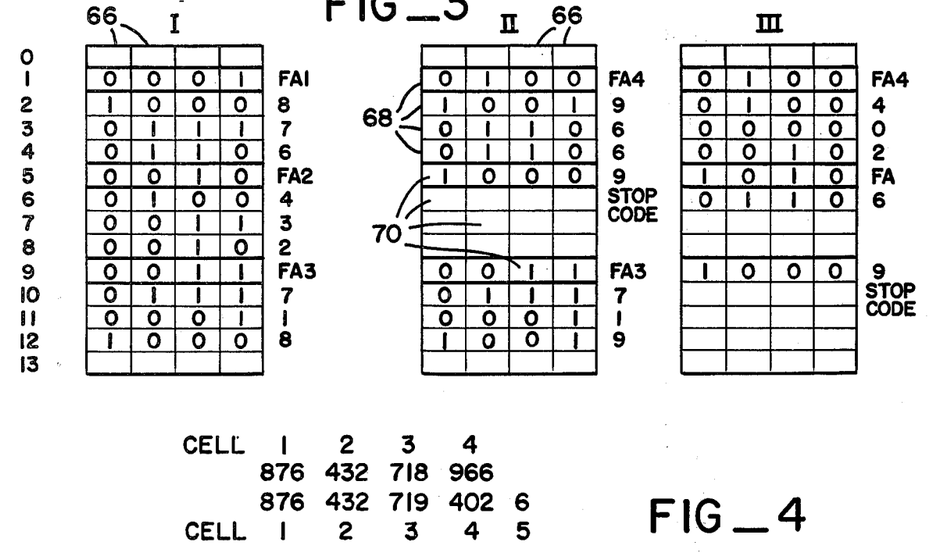
FIG. 4 is a pictorial representation of a series of holograms of a single holographic channel of the memory and illustrates the manner in which two successive numbers are recorded utilizing the data compression of the present invention.

Referring to FIGS. 1, 2 and 4, to fully utilize the storage space provided by holograms 20 on film strip 10, the digits of the reference numbers are sequentially recorded without regard to the hologram row in which they actually appear. Thus, the first digit of a number may appear on any one of the hologram rows 2 through 13 (rows 1 and 14 being reserved for auxiliary purposes). Accordingly, the digits of any given number may be recorded on more than one, e.g. on two successive holograms of the film strip. In this manner, no data storage space is wasted when the reference number has more or fewer digits than there are available rows in the hologram.

Referring particularly to FIG. 4, each hologram is a record of 4×14 binary spot pattern defined by four columns 66 and fourteen rows 68 which define fifty-six cells 70. "0" in the pictorial representation of FIG. 4 identifies a dark spot and "1" in the field represents a light spot which, when the hologram is reconstructed, generate a corresponding spot pattern of dark and illuminated spots or fields.

In the example illustrated in FIG. 4, the number 876 432 718 966 is first recorded on holograms I and II. For the moment the "FA" addresses illustrated in FIG. 4 are disregarded. It will be observed that the last digit of this number is recorded on the fourth row of hologram II followed by a stop code to identify the end of the number. If, in the case illustrated in FIG. 4 each hologram could only store digits of one number 10 rows and more than ⅔ of the storage space of hologram II would be unused and wasted. With the provision of the stop code, however, and the continuous digit recordation employed by the present invention such waste is eliminated. Comparator 62 includes enabling circuitry responsive to the stop code to initiate the comparison of the number entered into the keyboard and stored in RAM 96 with the digits read out by scanner 60 and stored in memory 118 after the occurrence of each stop code.

To further reduce the required data storage space, the present invention employs data compression. Still referring particularly to FIG. 4, each number stored in the holographic memory of the invention is divided into digit "fields" of two or more digits and preferably three digits each. Thus, the first three digits of the sample number, namely "876" comprise number field 1; the second three digits, namely "432" comprise number field 2; and so on. The number fields are recorded on the hologram and each such field is preceded with an identifying code referred to as a "field address" or "FA" followed by the appropriate number to relate the field address to the corresponding field. Thus, a field address can be identified as being the digit recorded on each fourth row of each hologram, that is on rows 1, 5 and 9 and the number recorded in such row identifies the field to which the following three digits belong. Thus, the first three digits of the first number illustrated in FIG. 4 are identified in row 1 of hologram I with the binary code for the number 1; the second number cell is identified with the binary code for number 2 on row 5 and so on until the fourth number cell is given field address "4" in line 1 of hologram II. As above described, the last digit of the number, that is the last digit of the last number field is followed with a stop code. In accordance with the present invention the stop code is always placed in a field address row, that is one of rows 1, 5 or 9 and is represented by binary 8, thus allowing the system to record a total of 8 fields per recorded number having up to 24 digits. Experience has shown that this number of digits far exceeds any digit number currently in use. If numbers having more than 8 fields are to be employed, the capacity of the memory can, of course, be increased by using a different stop code.

Up to the present, the recordation of the number in the holograms saves no space, in fact the addition of field address and stop codes used up five additional rows plus the three unused rows following the stop code.

Assuming that the next number to be recorded in the memory is 876 432 719 402 6, one immediately observes that all digits in the first two fields of the next number are identical to the digits in the first two fields of the preceding number. Accordingly, the first two fields are not recorded and the second number commences with field address "3" followed by the digits of field 3, that is by "719".

Referring to FIGS. 2 and 4, memory 118 includes circuitry in which the digits belonging to the number fields lower than the first recorded field address of the number following the stop code are retained as part of the following number for comparison to the keyed-in number. Specifically, memory 118 may comprise a plurality of registers corresponding to respective number fields. The first addresses are applied to the respective registers to enable the receipt of data. Thus, the field address will enable the appropriate register to receive the digits from detector 18. For example, the field address "3" will enable the register corresponding to the third field, so that the digits detected by detector 18 will be entered therein, while the digits previously stored in the registers corresponding to the first and second fields will be undisturbed. In this manner, the duplication of identical data from number to number is eliminated, resulting in a decrease in the memory bulk, a resulting decrease in the readout time, and thus a shortened average time before an address can be reached. Experience with memories for credit cards, bad checks and the like has shown that there is, on the average, a 30% memory bulk reduction for instances in which the number stored in the memory have 12 digits (and assuming a 14-row matrix with two auxiliary rows reserved for other purposes) and a 60% to 70% memory bulk reduction under the same conditions when the stored numbers comprise 13 digits. This leads to a corresponding reduction in the average memory access time.

Referring now to FIGS. 1 and 3, the arrangement of holograms on film 10 and the information carried by the holograms is described in greater detail. The film strip is generally divided into first end zone 72 (end zone I) located adjacent the left end 76 of the film which defines the original or beginning film position. End zone I is spaced apart and followed by a spaced apart holographic index 78. Between the end of the holographic index and the beginning of holographic memory 80 is a second end zone 82 (end zone II). The film may further include an update or addendum zone 74 which is ordinarily placed between end zone II and the memory. Memory 80, the end zones, the index and the addendum zone comprise an equal number of channels. In the presently preferred embodiment of the invention in which the film strip 10 is a standard 35 mm film strip 40 channels are provided.

End zone I comprises 40 channels 85 that are aligned with channel 84 of memory 80. Each channel is defined by holograms that store information identifying the end zone I as such to indicate the proximity of film end 76 and the original film position. The end zone I holograms may also carry channel information to enable the determination which channel is being interrogated.

End zone II also has a channel 86 for and in alignment with each memory channel 84. The holograms in end zone II channels 86 store information which identifies the particular memory channels with which it is aligned. The uppermost or top channel 86 of end zone II identifies the corresponding memory channel as channel No. 0 while, in the above given example, the bottom or last end zone II channel would identify the corresponding memory channel as channel No. 39. Thus, each channel 86 of end zone II carries different information in contrast to the channels of end zone I which may all carry like information.

Index 78 is also defined by a channel 88 for and in alignment with each memory channel 84. All index channels carry identical information. Each index channel is defined by a plurality of serial holograms which provide the following information:

1. The memory channel 84 on which a given number, e.g. a given credit card number, would be recorded by identifying the card by its type and number.
2. The number of digits the reference number, e.g. the credit card number, has. It may also carry information whether or not one or more of the digits should be ignored or information relating alpha characters of the card to a number (e.g. as on a telephone dial).
3. The parity check calculation, if any, that is to be performed on the number entered into the keyboard.

In the preferred embodiment of the invention this information is stored in the index in the form of holographically recorded "groups numbers". A group number identifies the parity check, if any, that is to be performed; the memory channel 84 on which the keyed-in number would be recorded by identifying the lowest and highest number recorded on such channel; and the number of digits the keyed-in number, e.g. the credit card number, has. Thus, in instances in which only one number system or credit card type is recorded on a given channel a single group number is provided. If two or more credit card types are recorded on a given channel, two or more group numbers are recorded for such channel in the index.

Addendum zone 74 may be provided to enable the updating of memory 80 without the need for a completely new master from which film strip 10 is made each time there occurs a change in the information stored in the memory. This is of particular importance in applications in which the memory strip of the present invention is used for credit verifications since there is normally a continuous change in the credit status of some of the card holders within a given credit card system. Accordingly, addendum zone 74 includes holograms aligned with the holograms of memory 80 which store updated credit information. For example, a previously good credit card number, which therefore was not recorded on the memory, might become delinquent. Such a number is entered in the holographic form on an addendum channel which is aligned with the memory channel in which such number would ordinarily be recorded. Similarly, if a delinquent card number stored in the memory is to be returned to a current status a corresponding holographic record is entered in the appropriate addendum zone channel.

In operation the laser is directed to the appropriate memory channel and first searches the addendum zone for a match as hereinafter described. If one is found the credit status of such number is ascertained from the addendum zone. If no match is found the laser continues to search the memory in the normal manner. This approach permits the use of a given master which can be relatively inexpensively and frequently updated by including the addendum and duplicating the master with the addendum on low cost copies of film strip.

Turning now specifically to the addressing of memory 80, a given number, such as the number of a credit card, is keyed into keyboard 64 and stored in RAM 96. The entered number is preceded by a prefix to identify the number system, e.g. the credit card type. This prefix is a number that is alpha related as on a telephone dial. For example, if the card were an "American Express" credit card, it might be preceded by the prefix "29"; if the card were a "Master Charge" credit card, it might be preceded by a prefix "62"; if the number were that of a checking account, it might be preceded by the prefix "25"; and if the number were a driver's license number it might be preceded by the prefix "35". It is apparent that any other desired prefix or digit continuation could be employed.

When the number is keyed into the keyboard, the laser 12 is activated to project the laser beam through the hologram on film strip 10. End zone 72 is aligned with the laser beam and causes the generation of a spot pattern on detector 18 which indicates that the film strip is in its original or beginning position. Film drive activator 90 thereupon signals film drive electronics 92 to activate film drive motors 14 and advance film strip 10 towards the left, as viewed in FIGS. 1 and 3.

The operating sequence in the event that the laser beam does not illuminate one of the end zones I is described below.

Figure 5:
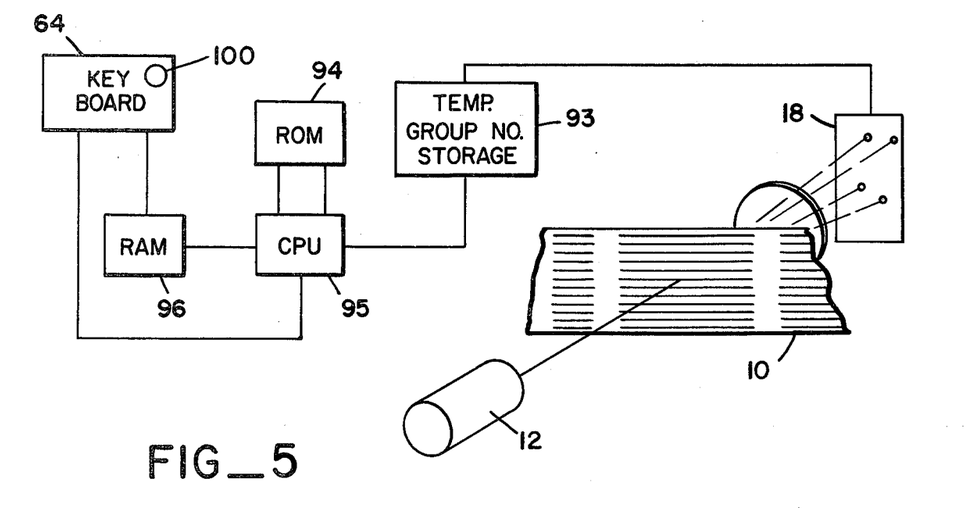
FIG. 5 is a fragmentary, schematic illustration of the elements forming the parity check means of the present invention.

As the film continues to be advanced index 78 and more particularly one of the index channels 88 is illuminated by the laser beam. In the index a group number is obtained for the number that was entered in the keyboard. Referring now briefly to FIG. 5, the group number obtained from the index is stored in a temporary data storage device 93 such as a random access memory while a read-only memory (ROM) 94 stores instructions for performing a variety of parity checks, such as Mod 10 or Mod 11 parity checks. A central processing unit (CPU) 95 receives the group number read-off spot pattern detector 18, addresses the ROM 94 for the proper parity check calculation and then calculates the parity number on the keyed-in number stored in another RAM 96. If the parity digit of the number stored in RAM 96 matches that calculated by CPU 95, the process of reading the index and thereafter the memory continues. If the match fails the CPU signals keyboard 64 to arrest further forward motions of film transport motors 14, to return the film to its original position and/or signals that the keyed-in number was a "wrong" number by illuminating a warning light 100.

Referring again to FIGS. 1 and 3 and assuming that the parity check is positive, namely that the parity digit of the number entered in the keyboard and the parity digit computed by CPU 95 match, and while the CPU makes the parity check, the film continues to be advanced until the laser beam reaches end zone II. Once the laser beam arrives at end zone II further forward motion of the film is temporarily halted to allow time for aligning the beam with the proper memory channel 84. End zone II is of sufficient width so that the beam is always within the end zone II limits to assure that the end zone II holograms can be read. This requires a minimum length for end zone II of about 0.25 inch and a preferred length of about 0.75 inch.

Each channel 86 of end zone II includes holograms that identify the channel by its number. Initially laser beam 16 generates a spot pattern on detector 18 which identifies the channel number on which the laser currently reads. The channel number is sent to a comparator 102 which receives as a further input from the temporary storage 93 the desired channel position. The output of comparator 102 then activates the movable mirror positioning motor 36 via suitable drive electronics 106 for moving movable mirror 30 in one or the other direction to raise or lower the laser beam with respect to the film strip until the laser is aligned with the desired channel whereupon the mirror positioning motor is arrested. The reading of the desired channel thereafter proceeds as will be described in greater detail hereinafter.

Figure 7:
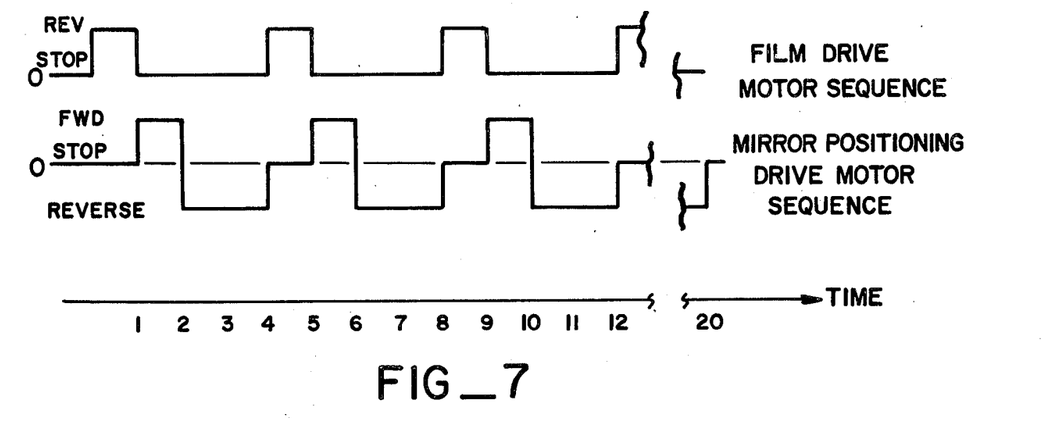
FIG. 7 is a timing diagram for the initialization means illustrated in FIG. 6.
Figure 8:
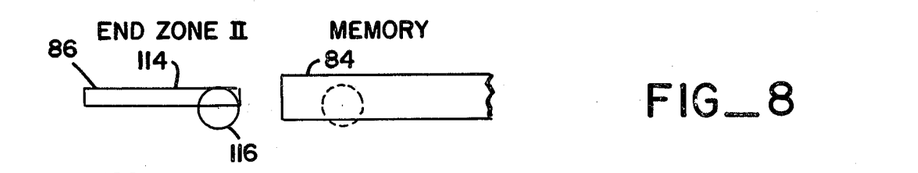
FIG. 8 illustrates the manner in which a hologram is centered with respect to a holographic memory channel in accordance with the present invention.
Figure 9:
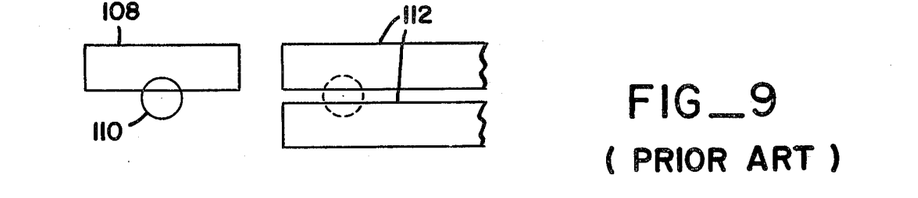
FIG. 9 illustrates the centering of a hologram with respect to a holographic memory channel in accordance with the prior art.

Referring now briefly to FIGS. 7 and 8, the movable mirror positioning motor is arrested in response to the channel position information on the end zone II holograms. As soon as the corresponding spot pattern appears, comparator 102 sends a stop signal. However, due to unavoidable, though small, differences in the operating characteristics for the motor the actual relative position of the laser beam may vary. In the past and as illustrated in FIG. 9, lateral laser beam positioning holograms 108 (which correspond to end zone II channels 86) were of the same width as the holograms with which the laser beam 110 is to be aligned, e.g. with holographic memory channel 112. Attempts have been made to adjust the motors operating characteristics so that the laser beam will ultimately be centered with respect to the memory channel. However, the small dimensions, the holograms having a total width of only about 0.020 inch and the laser beam having a slightly smaller diameter, frequently resulted in laser beam misalignments as indicated in phantom lines in FIG. 9 in which a substantial and sometimes a major portion of the laser beam was off the desired memory channel. In fact, as also illustrated in FIG. 9, in instances where the spacing between the channels is small, say 0.008 inch or less, the laser beam might simultaneously illuminate both channels thereby generating a useless double spot pattern. Thus, prior art lateral laser beam alignment systems require the utmost precision to assure satisfactory results.

To alleviate this problem, the present invention constructs the lateral laser aligning hologram 114, that is hologram channel 86 of end zone II, substantially narrower than the width of the corresponding memory channel 84 while maintaining their center lines in mutual alignmemt. In this manner, substantially all of laser beam 116 is within the boundaries of the memory channel as illustrated in phantom lines in FIG. 8, even though the relative misalignment between the laser beam and hologram 118 is the same as that illustrated in the prior art shown in FIG. 9. The difference between the two is that in accordance with the present invention the lateral positioning hologram is not reproduced until a later point in time at which a substantial portion of the beam is already laterally within the memory channel boundaries while the prior art the first hologram reproduction coincided with the first entry of the laser beam into the channel boundary. Accordingly, with lesser precision and cost the present invention provides a substantial improvement in the lateral alignment of laser beams in holographic memories of the type described herein. To enhance the accuracy with which the laser is aligned with the memory channel a self-centering laser beam servo mechanism (not separately shown) can be provided.

Referring now to FIGS. 1 through 4, after the laser beam is aligned with the desired channel film drive motors 14 are again energized and the reading of the holographic memory begins. As is more fully described in the above-referenced co-pending patent application, each holograph includes a synch bit which is detected by the scanner activator 58 which in turn activates electronic scanner 60 to scan photodiode detector 18. The number scanned from the detector is temporarily stored in a memory 118 and applied to comparator 62. The comparator receives as a second input signal the number entered into keyboard 64 and in RAM 96. If comparator 62 finds no match between the keyed-in number and the numbers stored in the selected channel 86 of holographic memory 80, a green light 120 or a chosen symbol or legend on a panel 122 of the keyboard is illuminated. If a match is found, a red light 124 on the panel is illuminated. In addition, a grading circuit 126 generates a grading signal for the illumination of one of the plurality of indicator lights 128. The grading signal provides qualitative information such as maximum credit level, a stolen credit card, etc. relative to the number. The indicator lights are coded to provide the qualitative information by advising the operator of maximum credit levels, a suspicion of fraud and/or use of a lost or stolen card, etc. Information for the grading circuit is stored on the three hologram rows following stop code 8 and thus is under the same address as the stop code to assure that the grading information applies to the number just read.

The signal indicating to the operator the result of his search is flashed to him as soon as a match is found and the grading rows, that is the three hologram rows following the stop code have been read. To speed up the process the numbers are recorded in their ascending or descending order on the memory channels and comparator 62 is programmed to generate a "no-match" signal to illuminate green light 120 as soon as the number being searched is higher or lower than the number entered in keyboard 64. After a "match" or "no-match" signal has been generated motor drive electronics 92 automatically reverses motors 14 and returns film 10 to its original position.

The digits being scanned off the detector 18 are stored in units that correspond to the number cells under the corresponding field address. As previously described, memory 118 is enabled by the field address so that the number units are entered into regions corresponding to the appropriate cell. All number units having lower field addresses are thus retained in the memory for readout in conjunction with the higher field addresses of the number next recorded on the memory to thereby generate the complete, full digit number next recorded in holographic memory 80 for use in comparator 62 as above described.

To assure that there is sufficient time within which to perform the number integration and comparing the speed of motors 14 is computer controlled by reading the synch bits of the holograms in the holographic memory. In a presently preferred embodiment of the invention the motor speed is 1300 holograms per second. If the speed deviates therefrom, the drive electronic controls 92 adjust the motor speed by correspondingly increasing or decreasing the voltage impulses supplied to the motors. This same system can be employed to control or reverse the motor for re-reading a given hologram in the event that the motor speed exceeded the reading capabilities of the system.

Figure 6:
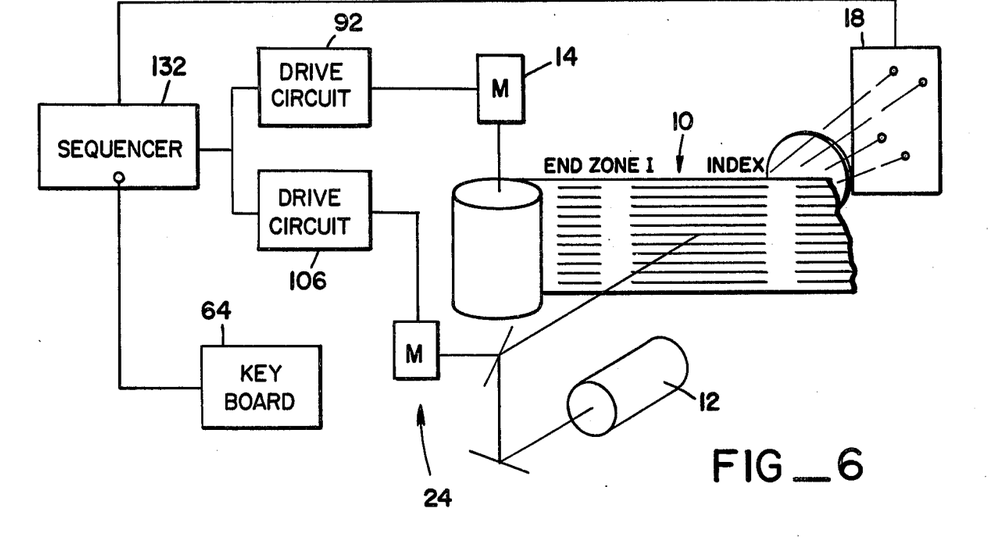
FIG. 6 is a fragmentary schematic illustration of the means for automatically aligning the laser beam with a holographic memory channel and positioning the film in its original or startup position.

Referring now to FIGS. 6 and 7, the present invention also provides a failsafe system for assuring that the film strip 10 is in its original position before the scanning of the index and the memory can commence. As described above, film transport motors 14 are energized to advance the film and bring the holographic index 78 within the view of the laser after it has been determined that the laser beam is aligned with end zone I. If, after a number has been entered in the keyboard and the laser has been activated no end zone I identifying spot pattern is obtained an initializing system 130 is activated to automatically position the film so that the laster light is directed at end zone I.

The initializing system comprises a sequencer 132 that activates drive circuits 92 and 106 for the film strip drive motor 14 and the mirror positioning motor 36, respectively. If, after a number has been entered into the keyboard, no end zone I identifying spot pattern is generated and detected, sequencer 32 activates motor 14 to backtrack film strip 10 at the relatively slow speed while the detector 18 continues to be scanned for an end zone I signal. The sequencer presently activates the film drive motor 14 for one second as illustrated in the timing diagram of FIG. 7. After a one second backtrack movement, the film drive motor is deactivated and the mirror positioning motor 36 is energized to move the mirror and thereby the reflected laser beam in one direction, say upwardly with respect to the film strip, for one second. If, after the end of the one second laser repositioning, no end zone I signal is detected the sequencer reverses the mirror positioning motor 36 in a downward direction and continues the reverse movement for a two second time span. The sequencing of the mirror drive motor is also diagrammed in FIG. 7.

If after the end of a complete cycle no end zone I signal is detected, the whole cycle is repeated until the laser beam is finally positioned on end zone I. During this time interval all searching of the index end zone II and the memory is of course suspended and is not commenced until and unless end zone I is finally located. To eliminate the possibility of an endless searching as would be the case if, for example, film strip 10 were broken, sequencer 132 includes a timing circuit which automatically discontinues all further backtracking motion after a predetermined time interval. The time interval is chosen so that end zone I could be located even under the extreme circumstance in which the full film length had to be recovered to place the film in its original position. In this manner the laser beam can be automatically aligned with both the end zone I and a holograph channel without regard to tolerances in the manufacture of both the film and particularly of the cassette, which is a mass produced item that is subject to relatively large manufacturing tolerances in order to assure its low cost and ready replaceability.

We claim:

1. A binary data storage and retrieval system for the high-speed determination of the presence or absence of a given information unit comprising an elongate strip having a multiplicity of individual holograms evenly distributed over a plurality of elongate hologram channels on the strip, the holograms defining a holographic memory, each hologram being a holographic record of a binary spot pattern; a light source for generating binary spot patterns from holograms in any one of the channels by illuminating holograms belonging to such channel only; means for detecting such generated spot patterns; the strip including holographic index means identifying the holograms in each channel for selecting the channel in which the information unit would be recorded if present in the memory; means for directing light from the source to the selected channel; and advancing means cooperating with the light directing means for first searching the index, thereafter directing the light to the selected channel and thereafter reading the memory.

2. A system according to claim 1 wherein the holographic memory comprises a memory of multidigit numbers; and wherein at least some of the individual holograms include binary data pertaining to more than one number.

3. A system according to claim 1 wherein the holographic memory comprises a memory of multidigit numbers; wherein each number is divided into digit fields, each field comprising a plurality of digits; and wherein the memory includes a binary field address for each field.

4. A system according to claim 3 wherein the binary field address comprises a binary number selected from binary 0 through binary 7.

5. A system according to claim 3 wherein the last digit of each number stored in the memory is followed by a holographic stop code.

6. A system according to claim 5 wherein the stop code comprises a preselected binary number.

7. A system according to claim 6 wherein the binary number of the stop code comprises binary 8.

8. A system according to claim 5 wherein the stop code comprises a multidigit cell and a preselected field address associated with such field.

9. A system according to claim 1 wherein the memory comprises a memory of multidigit numbers recorded in binary form, each number being divided into a plurality of digit fields, each field having a plurality of digits and being identified by a field address also recorded on the memory in binary form.

10. A system according to claim 9 wherein the numbers are recorded in an ascending or descending order; wherein each field including the last digit of a number is followed by a stop code recorded in the memory; and wherein each following number commences with a field and a corresponding field address which identifies the field including the lowest digit in such following number which differs from the preceding number to thereby effect a data compression by eliminating the duplication of identical data and effect a corresponding reduction in the bulk of the memory.

11. A data storage and retrieval system comprising a holographic memory recorded on a strip, the memory having a plurality of adjacent individual holographs, the memory storing a multiplicity of information sets, each set being defined by a plurality of information units, at least some of the sets being recorded on more than one individual hologram, means for generating reproductions of the holograms in the memory, and means for reading the reproductions.

12. A system according to claim 11 including a stop code recorded on the memory following each information set to signal the end of such set and the beginning of a new set.

13. A system according to claim 12 wherein the information units recorded on the memory for each following information set comprises such units of the following set which differ from the corresponding units in the immediately preceding set.

14. A holographic memory comprising a photographic strip having recorded thereon a multiplicity of individual holograms defining the memory, the holograms being arranged side-by-side in parallel hologram channels, the strip further including a holographic index identifying the information stored in the holograms in the memory channels, the index being defined by a plurality of holograms stored side-by-side along a line parallel to the channels.

15. A memory according to claim 14 including an index for each channel, the indexes being identical.

16. A holographic memory of a multiplicity of multi-digit numbers, the memory comprising a photographic film and a multiplicity of individual holograms recorded on the film and defining the memory, each hologram representing a holographic record of a binary spot pattern of a plurality of digits, at least some of the numbers being recorded on more than one hologram.

17. A memory according to claim 16 including a stop code recorded on the hologram after each number.

18. A memory according to claim 17 including means recorded on the hologram identifying the relative position of each digit within a given number.

19. A memory according to claim 18 wherein the digit identifying means for at least some of the numbers comprises means identifying digits other than a first digit of the number.

20. A memory according to claim 18 wherein the digit-identifying means comprises field addresses for digit fields comprising more than one digit.

21. A holographic film memory for use in a holographic data retrieval device comprising a film strip, a holographic memory defined by a multiplicity of holograms arranged in a plurality of longitudinally extending, parallel hologram channels of a constant width, and at least one additional hologram for each channel, the additional hologram being spaced from the corresponding channel, aligned therewith and having a lesser width than the holograms in the corresponding channels to facilitate the centering of a laser beam with respect to the channels when the film is used in said device.

22. A memory according to claim 21 wherein the additional hologram has a length measured parallel to the channels of at least about one-quarter inch.

23. A memory according to claim 21 wherein the additional hologram includes holographically recorded information identifying the memory channel that corresponds to such additional hologram.

24. A memory according to claim 23 wherein the film strip includes an index defined by a plurality of holographic recordings identifying the information recorded on each channel, and wherein the additional holograms are positioned between and spaced from the index and the memory.

25. A memory according to claim 24 including further holograms recorded on the strip, the further holograms being disposed on the side of the index remote from the additional holograms, the further holograms having recorded information identifying an adjacent end of the strip as a beginning of the strip.

26. A memory according to claim 25 wherein the index and the further holograms each comprise at least one holographic recording for each memory channel which is in alignment with the corresponding channel.

27. A method for determining the presence or absence of a given information unit in a holographic mass memory comprising the steps of providing an elongate strip having a multiplicity of individual holograms distributed over a plurality of parallel, elongate hologram channels on the strip, the holograms defining the holographic memory, each hologram being a holographic record of a binary spot pattern, the strip further including a holographic index spaced from the memory and identifying the holograms in each channel; directing a light beam onto the index to thereby generate a hologram identifying the holograms in each channel; from the generated hologram determining the channel in which the information unit would be recorded if present in the memory; directing the light beam to the selected channel; and scanning the selected channel with the light beam to thereby generate binary spot patterns for the holograms in the selected channel; and comparing the information unit with the binary spot patterns to determine the presence or absence of a match and a corresponding presence or absence of the information unit in the memory.

28. A method of forming a holographic mass memory of multi-digit numbers recorded in binary form, the method comprising the steps of dividing each number into a plurality of digit fields, each field providing for the recordation of a plurality of digits and being identified by a field address; providing an elongate strip; arranging the number in an ascending or descending order; recording on the strip a multiplicity of individual holograms distributed over a plurality of elongate, parallel hologram channels on the strip; by recording the digits belonging to the corresponding digit fields in binary form; recording for each field an associated binary field address; recording in binary form a stop code for each multi-digit number; and recording for each successive number only such digit fields and corresponding field addresses which include the lowest digit of the following number which differs from the preceding number to thereby effect a data compression by eliminating the duplication of identical data and to thereby further effect a corresponding reduction in the bulk of the memory.

29. A method according to claim 28 including the step of recording on the strip in spaced apart relation to the memory an index by holographically recording on the index the information recorded in each channel.

* * * * *